(12) United States Patent
Hsu et al.

(10) Patent No.: US 10,418,940 B2
(45) Date of Patent: Sep. 17, 2019

(54) RADIO FREQUENCY INTERFERENCE MITIGATION IN CRYSTAL OSCILLATOR CIRCUITRY

(71) Applicant: Intel Corporation, Santa Clara, CA (US)

(72) Inventors: Hao-Han Hsu, Portland, OR (US); Jaejin Lee, Hillsboro, OR (US); Chung-Hao Chen, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 198 days.

(21) Appl. No.: 15/381,902

(22) Filed: Dec. 16, 2016

(65) Prior Publication Data

US 2018/0175795 A1    Jun. 21, 2018

(51) Int. Cl.
 *H03B 5/36* (2006.01)
 *H03B 5/12* (2006.01)
 *H03H 1/00* (2006.01)
 *H03L 7/185* (2006.01)
 *H03B 5/32* (2006.01)
 *H03L 7/00* (2006.01)

(52) U.S. Cl.
 CPC ............ *H03B 5/36* (2013.01); *H03B 5/1243* (2013.01); *H03B 5/1265* (2013.01); *H03B 5/1293* (2013.01); *H03B 5/32* (2013.01); *H03H 1/00* (2013.01); *H03H 1/0007* (2013.01); *H03L 7/00* (2013.01); *H03L 7/185* (2013.01); *H03B 2200/0088* (2013.01)

(58) Field of Classification Search
 CPC ......... H03L 7/00; H03L 7/185; H03H 1/0007; H03H 1/00; H03B 5/32; H03B 5/1243; H03B 5/1293; H03B 5/1265
 USPC .......... 455/260; 331/108 C, 16, 158, 117 FE
 See application file for complete search history.

(56) References Cited

U.S. PATENT DOCUMENTS

| 5,225,792 | A | * | 7/1993 | Prakash | .................. H03B 5/32 331/158 |
| 5,675,295 | A | * | 10/1997 | Brebels | ............... H01L 21/8252 257/E21.697 |
| 2005/0212604 | A1 | * | 9/2005 | Cyr | ......................... H01L 24/48 331/16 |
| 2007/0241829 | A1 | * | 10/2007 | Sato | ....................... H03B 5/364 331/158 |

\* cited by examiner

*Primary Examiner* — Arnold M Kinkead
(74) *Attorney, Agent, or Firm* — Green, Howard & Mughal LLP

(57) ABSTRACT

An apparatus is provided which comprises: an oscillator circuit to generate a clock signal and transmit the clock signal over a signal line; a ground reference plane associated with the signal line; and one or more patterns formed in the ground reference plane, wherein the one or more patterns in the ground reference plane is to filter out noise from the clock signal transmitted over the signal line.

16 Claims, 6 Drawing Sheets

RADIO FREQUENCY INTERFERENCE MITIGATION IN CRYSTAL OSCILLATOR CIRCUITRY

BACKGROUND

Crystal oscillators are widely used in computing systems to generate clock signals. Crystal oscillators are generally sensitive to noise. For example, a consumer electronics device (e.g., a mobile phone or a smart phone, a computing tablet, a laptop, an Internet-of-things (IOT) device, a wearable device, a wireless-enabled e-reader, etc.) can operate near a crystal oscillator included in a computing system. The consumer electronics device can operate and transmit/receive signals at one or more radio frequency (RF) bands, as a result of which RF power can be injected into the crystal oscillator. This, for example, can increase a jitter in a clock signal generated by the crystal oscillator.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1A:
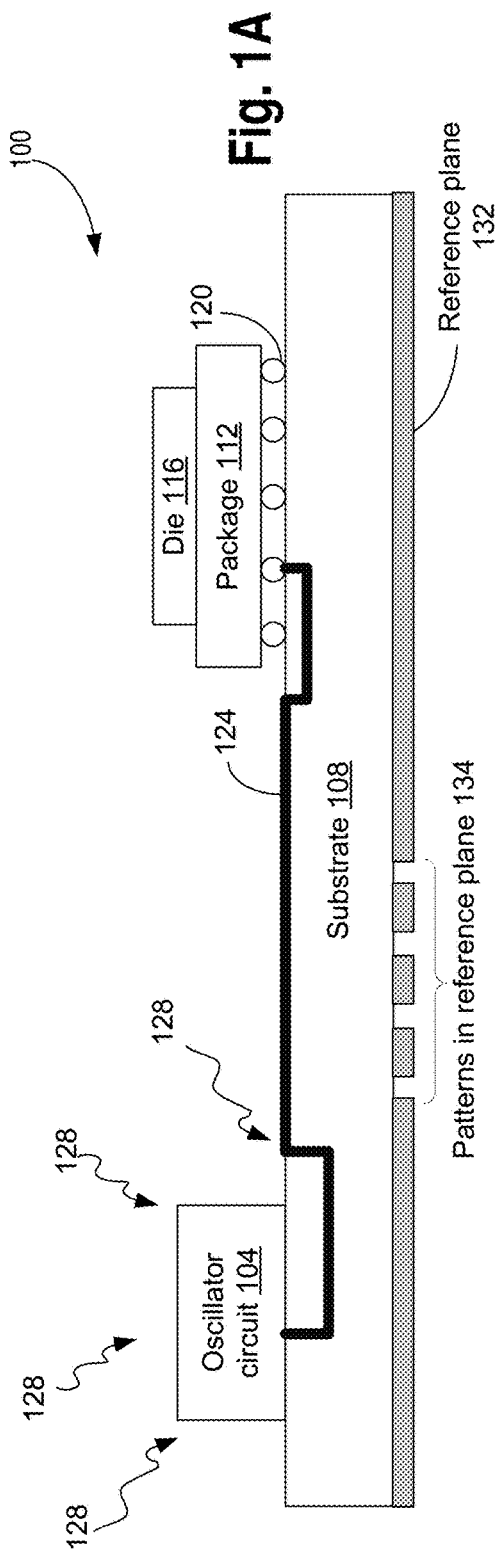
FIG. 1A illustrates a cross-sectional side view and FIG. 1B illustrates a top view of a semiconductor device that is configured to attenuate RF noise in a clock signal, according to some embodiments.

Crystal oscillators are generally sensitive to noise and external interference. A crystal oscillator, for example, is formed on a substrate, and a signal line connects the crystal oscillator to another component on the substrate. In an example, the signal line (e.g., that transmits a clock signal generated by the crystal oscillator) passes over a reference plane, e.g., a ground reference plane (although the signal line may not be connected with the reference plane, and the signal line and the reference plane are at two different layers of the substrate). In some embodiments, the reference plane beneath the signal line is patterned to form patterns in the reference plane. The patterns are formed, for example, by selectively etching the reference plane. For example, a first pattern is formed on a first side of the signal line, a second pattern is formed on a second side of the signal line, and a third pattern interconnects the first pattern and the second pattern. In an example, a section of the third pattern is formed underneath the signal line (although, as discussed above, the reference lane, including the patterns, do not come in contact with signal line). In some embodiments, the patterns in the reference plane act as a filter (e.g., an inductor-capacitor (LC) resonant filter) that attenuates signals transmitted over the signal line at specific frequency bands. Thus, the filter formed using the patterns in the ground reference plane can filter out high frequency noise from the clock signal transmitted over the signal line.

There are many technical effects of the various embodiments. For example, patterning the reference plane to filter out noise generated from interfering signals at the oscillator circuit has various advantages. As discussed in further detail herein later, the noise is substantially filtered out from the signal line, and the clock signal at the signal line at the output of the signal line is substantially noise-free. Additionally, the filter to filter out the noise does not need additional components to be installed. For example, no additional inductor, capacitor, on-board filters, on-board shielding mechanism to shield the oscillator circuit, etc. may be needed to filter out the noise. Rather, the reference plane is etched to form the patterns, where the patterned reference plane acts as a RF filter to filter out the noise in the signal line. The integration of the patterned reference plane can be easily incorporated in the design and manufacturing of a semiconductor device, without significant change in the design and layout of the semiconductor device or a change in the board layers of the substrate. In contrast, in a conventional system, relatively costly shielding may have to be undertaken to shield an oscillator circuit, to prevent the oscillator circuit from being affected by external interference signals.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices. The term "coupled" means a direct or indirect connection, such as a direct electrical, mechanical, or magnetic connection between the things that are connected or an indirect connection, through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level. The terms "substantially," "close," "approximately," "near," and "about," generally refer to being within +/−10% of a target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C). The terms "left," "right," "front," "back," "top," "bottom," "over," "under," and the like in the description and in the claims, if any, are used for descriptive purposes and not necessarily for describing permanent relative positions.

Figure 1B:
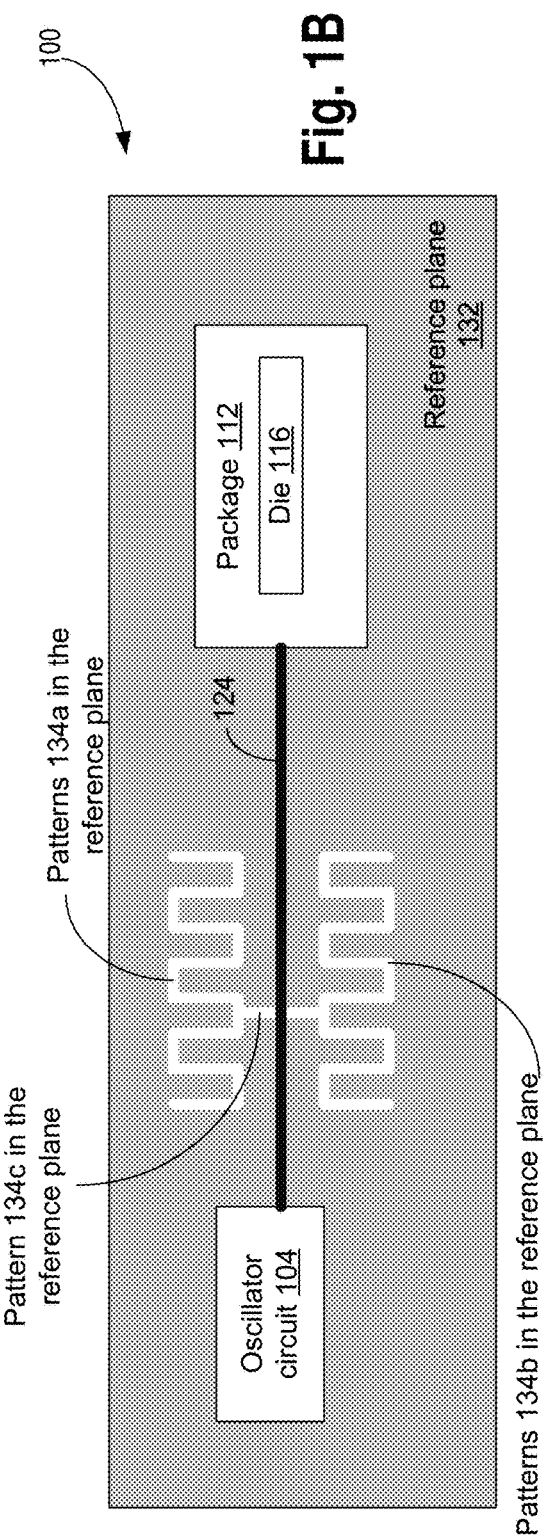

FIG. 1A illustrates a cross-sectional side view and FIG. 1B illustrates a top view of a semiconductor device 100 that is configured to attenuate radio frequency (RF) noise in a clock signal, according to some embodiments. The semiconductor device 100 can be incorporated in an appropriate computing device, e.g., a laptop, a desktop, a mobile phone or a smart phone, a server, an IOT device, a set-top box, a computing tablet, a wearable device, a wireless-enabled e-reader, etc.

The semiconductor device 100 comprises an oscillator circuit 104 formed on a substrate 108. In some embodiments, the substrate 108 is a printed circuit board (e.g., a motherboard), a printed board assembly (PBA), or the like. The oscillator circuit 104 is configured to generate one or more oscillating clock signals. In an example, the oscillator circuit 104 generates a clock signal and outputs the clock signal over a signal line 124. The oscillator circuit 104 can be of any appropriate type, e.g., a Peirce oscillator, a Colpitts oscillator, or the like.

In an example, the semiconductor device 100 comprises a semiconductor package 112 mounted on the substrate 108 via appropriate interconnect structures, e.g., solder balls 120. However, in other examples, the semiconductor package 112 can also be mounted using any other appropriate technique. In an example, the semiconductor package 112 comprises one or more semiconductor dies, e.g., a semiconductor die 116 (henceforth referred to as "die 116").

The signal line 124 traverses through the substrate 108 and propagates the clock signal to one or more other components of the semiconductor device 100. For example, the clock signal is transmitted via the signal line 124 to the die 116. The signal line 124 is embedded within the substrate 108, or traverses the substrate 108 as a trace on a top layer of the substrate 108.

The semiconductor device 100 further comprises a reference plane 132. In an example, the reference plane 132 is the ground plane, although in another example, the reference plane 132 can be a power plane. In an example, the reference plane 132 can be attached to any appropriate layer of the substrate 108. For example, the reference plane 132 is attached to a layer of the substrate 108 that is different from a layer through which the signal line 124 passes. In the example of FIG. 1A, the reference plane 132 is attached to a bottom layer of the substrate 108, and at least a part of the signal line 124 is formed over a top layer of the substrate 108.

In an example, the oscillator circuit 104 is sensitive to noise from one or more external sources. For example, a consumer electronics device (e.g., a mobile phone or a smart phone, a computing tablet, a laptop, an Internet of things (IOT) device, a wearable device, a wireless-enabled e-reader, etc.) can operate near the semiconductor device 100 (e.g., near the oscillator circuit 104). The consumer electronics device can operate, and transmit/receive signals at one or more radio frequency RF bands, as a result of which RF power can be injected into the oscillator circuit 104 if the consumer electronics device is placed at sufficient proximity to the oscillator circuit 104. In FIG. 1A, the interfering signals are labeled as 128. As a result of the interfering signals 128, the clock signal on the signal line 124 experiences high frequency jitters, as will be discussed in more details herein later.

In some embodiments, the reference plane 132 is patterned in one or more predefined patterns. For example, the reference plane 132 is selectively etched to form patterns 134 in the reference plane 132. FIG. 1B illustrates example patterns 134a, 134b and 134c, collectively referred to as patterns 134 in FIG. 1A. For example, the reference plane 132 comprises a metal layer. The metal layer of the reference plane 132 is etched to form the patterns 134, so that no metal of the metal layer of the reference plane 132 is present where the patterns 134 are formed. In some embodiments, the patterns 134 are formed by etching the metal layer of the reference plane 132 while the reference plane 132 is formed. In some other embodiments, the patterns 134 are formed by etching the metal layer of the reference plane 132 subsequent to the formation of the reference plane 132.

It is to be noted that in the top view of the semiconductor device 100 in FIG. 1B, the substrate 108 is not illustrated. For example, an actual top view of the semiconductor device 100 would illustrate at least a part of the substrate 108, but a modified top view in FIG. 1B does not illustrate the substrate 108—rather, FIG. 1B illustrates the reference plane 132 and the patterns 134, which would normally be not visible in the actual top view of the semiconductor device 100.

It is to be noted that although the pattern 134c in FIG. 1B is illustrated to be intersecting the signal line 124, the pattern 134c and the signal line 124 are not connected. For example, as illustrated in FIG. 1A, the signal line 124 and the reference plane 132 (i.e., the reference plane including the pattern 134c) belong to two different planes or levels. So, although the top view of FIG. 1B illustrates these two lines to be intersection, the pattern 134c and the signal line 124 are not connected.

FIG. 1B illustrates the patterns 134a and 134b to be two sets of symmetrical meandering lines joined by a connecting line (e.g., joined by the pattern 134c). However, the patterns 134 can be of any appropriate shapes and sizes, e.g., two sets of symmetrical or asymmetrical concentric circles, patterns that have wave-like shapes, triangles, etc.

In some embodiments, the pattern 134a is formed on a first side of the signal line 124, and the pattern 134b is formed on a second side of the signal line 124. The pattern 134c connects the two patterns 134a and 134b, and at least a section of the pattern 134c is formed underneath the signal line 124.

In an example and as discussed herein earlier, the reference plane 132 is a ground plane. For example, if current flows from the oscillator circuit 104 to the package 112 as the clock signal via the signal line 124, the current returns via the reference plane 132 form the package 112 to the oscillator circuit 104. The patterns 134 in the reference plane 132 act as a filter (e.g., an inductor-capacitor (LC) resonant filter) that attenuate signals transmitted over the signal line 124 at specific frequency bands. For example, noise introduced by the interference signals 128 in the clock signal is attenuated by the filter generated using the patterned reference plane 132.

Figure 2:
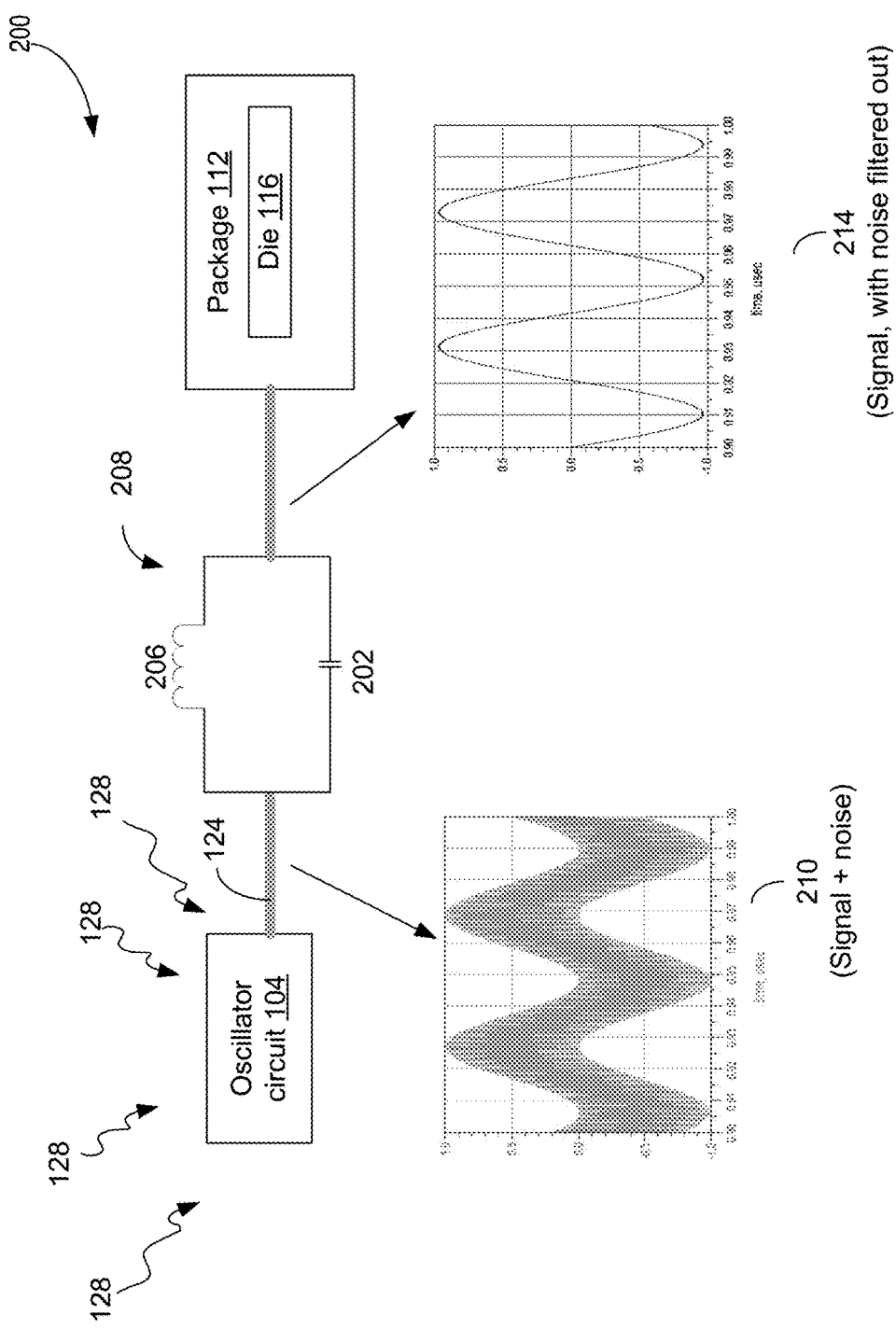
FIG. 2 illustrates a circuit model depicting an operation of the semiconductor device of FIGS. 1A and 1B, according to some embodiments.

FIG. 2 illustrates a circuit model 200 depicting an operation of the semiconductor device 100 of FIGS. 1A and 1B, according to some embodiments. As discussed herein earlier, the patterns in the reference plane 132 generate a filter 208 (e.g., an LC resonant filter), which is modeled using an inductor 206 and a capacitor 202 in FIG. 2. For example, there is no active circuit components (e.g., an inductor or a capacitor) in the semiconductor device 100 corresponding to the inductor 206 and the capacitor 202 of FIG. 2—rather, the inductor 206 and the capacitor 202 in the circuit model 200 of FIG. 2 respectively represent the parasitic inductance and parasitic capacitance of the filter 208 resulting from the patterned reference plane 132. The inductor 206 and the capacitor 202 are coupled in parallel and placed within the signal line 124 between the oscillator circuit 104 and the package 112 in the circuit model 200.

FIG. 2 also illustrates two graphs 210 and 214. The graph 210 on the left illustrates an example clock signal generated by the oscillator circuit 104, where the clock signal at the output of the oscillator circuit 104 is corrupted by the interference signals 128. Thus, the clock signal in the graph 210 has high frequency jitters or high frequency noise.

In some embodiments, the shape, size and/or the position of the patterns 134 are configured and calibrated to tune the inductance and capacitance of the inductor 206 and the capacitor 202, respectively. Merely as an example, the inductance of the inductor 206 can be based on a length and/or width of the patterns 134. For example, a higher total length and/or a higher width of the patterns results in a higher inductance of the inductor 206, and vice-verse. In another example, the capacitance of the capacitor 202 can be based on a distance or gap between two adjacent lines of the patterns 134. For example, a smaller gap between two adjacent lines of the patterns 134 results in a higher capacitance. Thus, the inductance and capacitance of the inductor 206 and the capacitor 202 of the filter 208 can be calibrated by changing the shape, configuration, size, and/or position of the patterns 134. Furthermore, the inductance and capacitance of the inductor 206 and the capacitor 202 of the filter 208 determine a frequency band which the filter 208 can attenuate. In an example, the filter 208 is designed to filter out frequencies that are most likely to be included in the interfering signals 128.

The graph 214 on the right illustrates the clock signal on the signal line 124 at the input of the package 112. Here, the noise in the clock signal is filtered out by the filter 208, resulting in a relatively noise-free clock signal at the input of the package 112, as illustrated in the graph 214. For example, the filter 208 prevents RF noise from propagating the signal line 124 from the oscillator circuit 104 to the package 112.

There are many technical effects of the various embodiments. For example, patterning the reference plane to filter out noise generated from interfering signals at the oscillator circuit 104 has various advantages. As illustrated in FIG. 2, the noise is substantially filtered out in the signal line 124, and the clock signal at the signal line 124 at the input of the package 112 is substantially noise-free. Additionally, the filter 208 to filter out the noise does not need additional components to be installed in the semiconductor device 100. For example, no additional inductor, capacitor, on-board filters, on-board shielding mechanism to shield the oscillator circuit 104, etc. may be needed to filter out the noise. Rather, as discussed with respect to FIGS. 1A, 1B, and 2, the reference plane 132 is etched to form the patterns 134, where the patterned reference plane acts as a RF filter to filter out the noise in the signal line 124. The integration of the patterned reference plane can be easily incorporated in the design and manufacturing of the semiconductor device 100, without significant change in the design and layout of the semiconductor device 100 or a change in the board layers of the substrate 108. In contrast, in a conventional system, relatively costly shielding may have to be undertaken to shield an oscillator circuit, to prevent the oscillator circuit from being affected by external interference signals.

Figure 3:
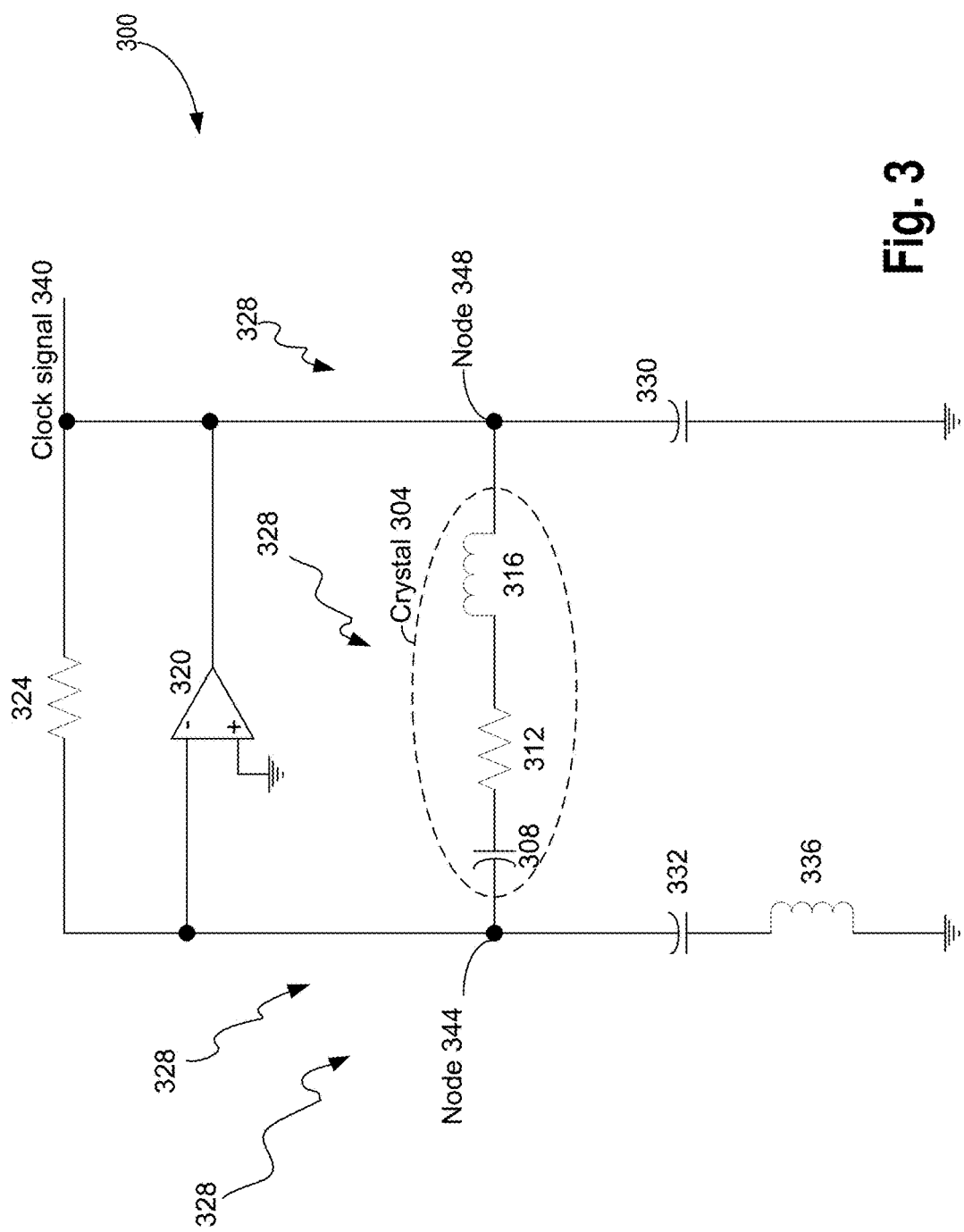
FIG. 3 illustrates an oscillator circuit configured to filter out RF noise in a clock signal generated by the oscillator circuit, according to some embodiments.

FIG. 3 illustrates an oscillator circuit 300 (henceforth referred to as "circuit 300") configured to filter out RF noise in a clock signal generated by the circuit 300, according to some embodiments. The circuit 300 can be incorporated in an appropriate computing device, e.g., a laptop, a desktop, a mobile phone or a smart phone, a server, an TOT device, a set-top box, a computing tablet, a wearable device, a wireless-enabled e-reader, etc.

In some embodiments, the circuit 300 comprises a crystal 304, which is represented by its equivalent circuit comprising a capacitor 308, a resistor 312, and an inductor 316. As illustrated in FIG. 3, the crystal 304 is coupled between nodes 344 and 348. In some embodiments, the crystal 304 can be of any appropriate type, e.g., a piezoelectric PZT crystal ceramic resonator, a piezoelectric quartz crystal resonator, and/or the like.

In some embodiments, the circuit 300 comprises an operational amplifier 320, which has an inverting input terminal connected to the node 344, and a non-inverting terminal that is grounded. An output of the operational amplifier 320 is coupled to the node 348. In some other embodiments (and although not illustrated in FIG. 3), the operational amplifier 320 can be replaced by one or more other active components, e.g., an inverter.

The circuit 300 further comprises a resistor 324 coupled between the nodes 344 and 348. In some embodiments, the resistor 324 acts as a feedback resistor, biasing the operational amplifier 320 in a linear region of operation and effectively causing the operational amplifier 320 to function as a high gain inverting amplifier. An output clock signal 340 of the circuit 300 is generated at node 348.

In some embodiments, the circuit 300 further comprises a capacitor 330 coupled between the node 348 and ground. In some embodiments, the circuit 300 further comprises another capacitor 332 coupled to the node 344. The capacitor 332 is grounded via an inductor 336. For example, the capacitor 332 and the inductor 336 are coupled in series between the node 344 and the ground.

The crystal 304, in combination with capacitors 330 and 332, forms a pi-network band-pass filter, which provides a 180-degree phase shift and a voltage gain from the output to the input at approximately the resonant frequency of the crystal. For example, at the frequency of oscillation, the crystal 304 appears inductive. Thus, the crystal 304 can be considered a large, high-Q inductor. The combination of the 180-degree phase shift (e.g., the inverting gain) from the pi-network, and the negative gain from the operational amplifier 320, results in a positive loop gain (e.g., a positive feedback), making the bias point set by the resistor 324 unstable, thereby leading to an oscillation and generation of the clock signal 340.

The circuit 300 is a modified version of a Peirce oscillator circuit. For example, the circuit 300 has the inductor 336 added in series with the capacitor 332, which is absent in a Peirce oscillator circuit. Accordingly, the circuit 300 is also referred to herein as a "modified Peirce oscillator circuit."

In some examples, similar to FIGS. 1A and 1B, the circuit 300 of FIG. 3 can experience radio frequency interferences 328 from one or more external sources, e.g., from one or more of a mobile phone or a smart phone, a computing tablet, a laptop, an IOT device, a wearable device, a wireless-enabled e-reader, etc. For instance, such an external RF signal source, when placed in close proximity to the circuit 300, can inject RF power into the circuit 300 at radio bands, resulting in jitters in the clock signal 340 generated by the circuit 300, e.g., as discussed with respect to FIGS. 1A and 1B.

In some embodiments, the inductor 336 and the capacitor 332, in series, form a notch filter. The filter can be appropriately tuned at radio bands, e.g., at a frequency band that is to be filtered out. In some embodiments, the inductor 336 has relatively low inductance at the frequency at which the clock signal 340 is generated, thereby having negligible impact to the normal operation of the circuit 300 (i.e., negligible impact to the clock signal 340 generated at the relatively low clock frequency). However, the filter generated by the combination of the inductor 336 and the capacitor 332 effectively filters out high frequency radio band noise signals injected in the circuit 300 by the interfering signals 328.

For example, assume that the clock signal 340 has a frequency of 24 Mega Hertz (MHz), and is affected by 800 MHz interfering signals 328. In this example, the inductor 336 can be selected such that the filter comprising the inductor 336 and the capacitor 332 is tuned substantially at 800 MHz, which filters out any noise introduced at the 800 MHz frequency, without significantly affecting the clock signal 340 generated at 24 MHz.

Figure 4:
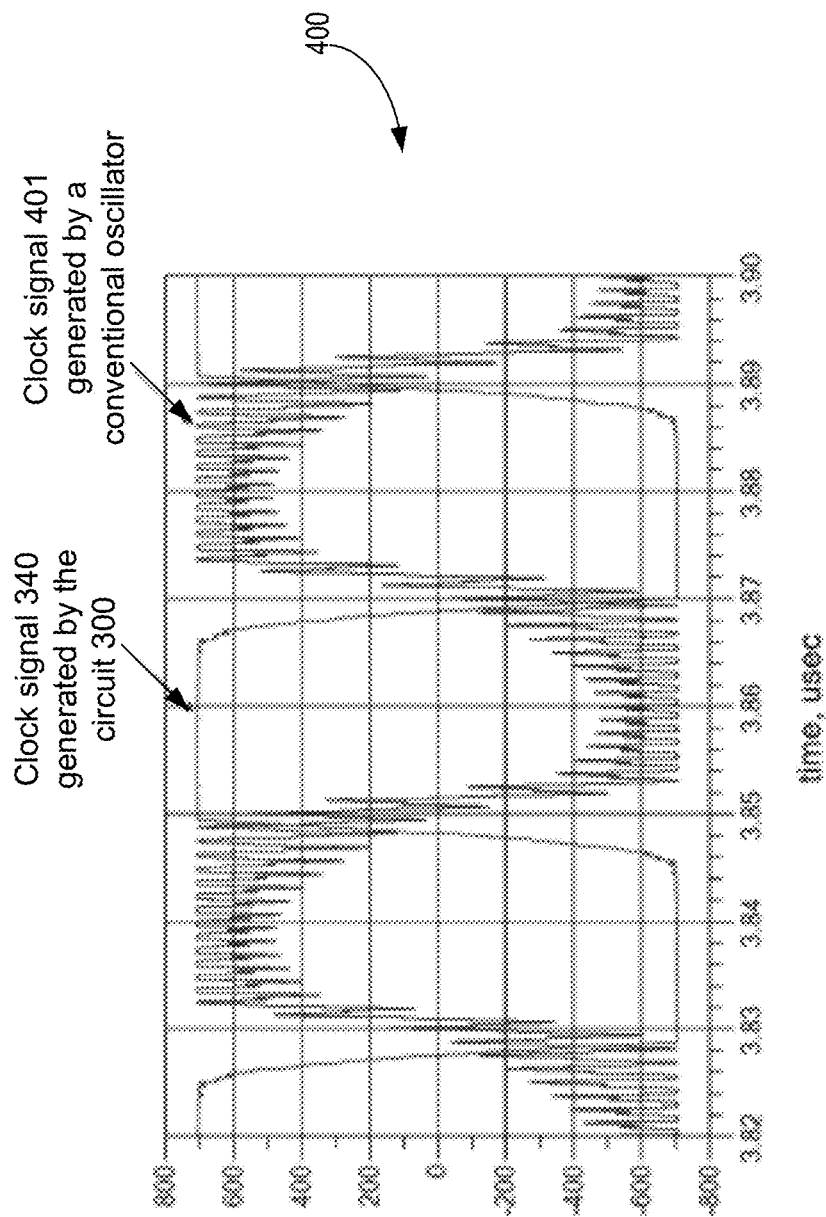
FIG. 4 illustrates a graph depicting the clock signal generated by the circuit of FIG. 3 and a clock signal generated by a conventional oscillator circuit.

FIG. 4 illustrates a graph 400 depicting the clock signal 340 generated by the circuit 300 of FIG. 3 and a clock signal 401 generated by a conventional oscillator circuit. Here, the x-axis is time in microseconds (ms), while the y-axis is amplitude in millivolts (mV). In FIG. 4, both the circuit 300 and the conventional oscillator circuit are assumed to include corresponding 24 MHz crystals, and interfering signals at 800 MHz frequency band is assumed to affect both the circuits. In the conventional oscillator circuit, as noise is injected at the 800 MHz frequency, the clock signal 401 exhibits jitter, the clock edge shifts left and right, and the edge transition of the clock signal 401 is no longer monotonic, thereby adversely affecting clock and signal integrity. However, in the circuit 300, the filter comprising inductor 336 and the capacitor 332 filters out the RF noise at 800 MHz from the clock signal 340, as illustrated in FIG. 4. Thus, in the clock signal 340, the transition edge is relatively clean and monotonic, without any significant noise included in the clock signal 340.

In the circuit 300 of FIG. 3, noise signals at a single frequency band can be filtered out by the filter comprising the inductor 336 and the capacitor 332. However, the interfering noise signal can come from different external noise sources, and can be at different frequency band(s). For instance, an external device (e.g., external to the device that includes the circuit 300) can operate at 800 MHz, while another external device can operate at 2.4 GHz. In such an example, interfering signals 328 can inject noise at 800 MHz and 2.4 GHz.

Figure 5:
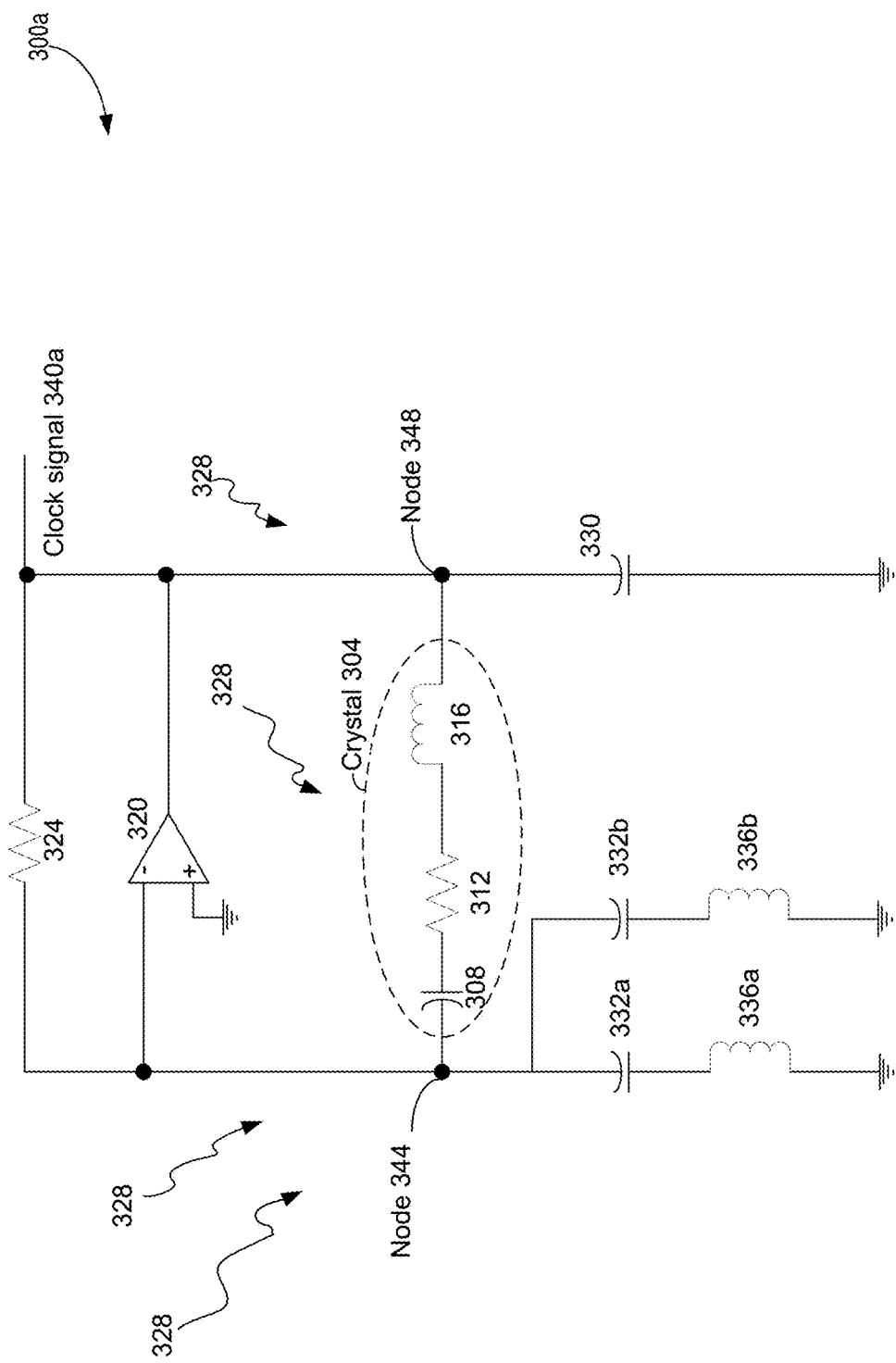
FIG. 5 illustrates an oscillator circuit configured to filter out RF noise at different frequency bands in a clock signal generated by the oscillator circuit, according to some embodiments.

FIG. 5 illustrates an oscillator circuit 300a (henceforth referred to as "circuit 300a") configured to filter out RF noise at different frequency bands in a clock signal generated by the circuit 300a, according to some embodiments. The circuit 300a is substantially similar to the circuit 300 of FIG. 3, and similar components in these two circuits are labeled using similar labels.

In some embodiments, a single branch of the capacitor 332 and the inductor 336 of the circuit 300 of FIG. 3 is replaced by two branches of capacitors and inductors in the circuit 300a of FIG. 5. For example, in the circuit 300a of FIG. 5, a first branch comprises a capacitor 332a and an inductor 336a coupled in series between the node 344 and ground. A second branch comprises a capacitor 332b and an inductor 336b coupled in series between the node 344 and ground.

In some embodiments, the summation of the capacitance of the capacitors 332a and 332b is substantially equal to the capacitance of the capacitor 330. Merely as an example, the capacitance of the capacitor 330 is about 12 pico-Farad (pF), the capacitance of the capacitor 332a is about 6 pF, and the capacitance of the capacitor 332b is about 6 pF. The inductors 336a and 336b can be selected to tune the frequencies of the above discussed first and second branches, e.g., to filter out the frequency bands of potential interference signals. For example, the inductance of the inductor 336a can be 0.7 nH such that the branch comprising the capacitor 332a and the inductor 336a is tuned at about 2.4 GHz. In another example, the inductance of the inductor 336b can be 6.6 nano Henry (nH) such that the branch comprising the capacitor 332b and the inductor 336b is tuned at about 800 MHz. Thus, the circuit 300a filters out noise signals at 800 MHz and 2.4 GHz frequency band (e.g., using the second and first branch, respectively), and the clock signal 340a is free from noise at these two frequency bands.

Although FIG. 5 illustrates two branches to filter out noise at two frequency bands, one or more additional branches of inductors and capacitors can be introduced in the circuit 300a between the node 344 and the ground, to further filter out noise at one or more additional frequency bands.

Figure 6:
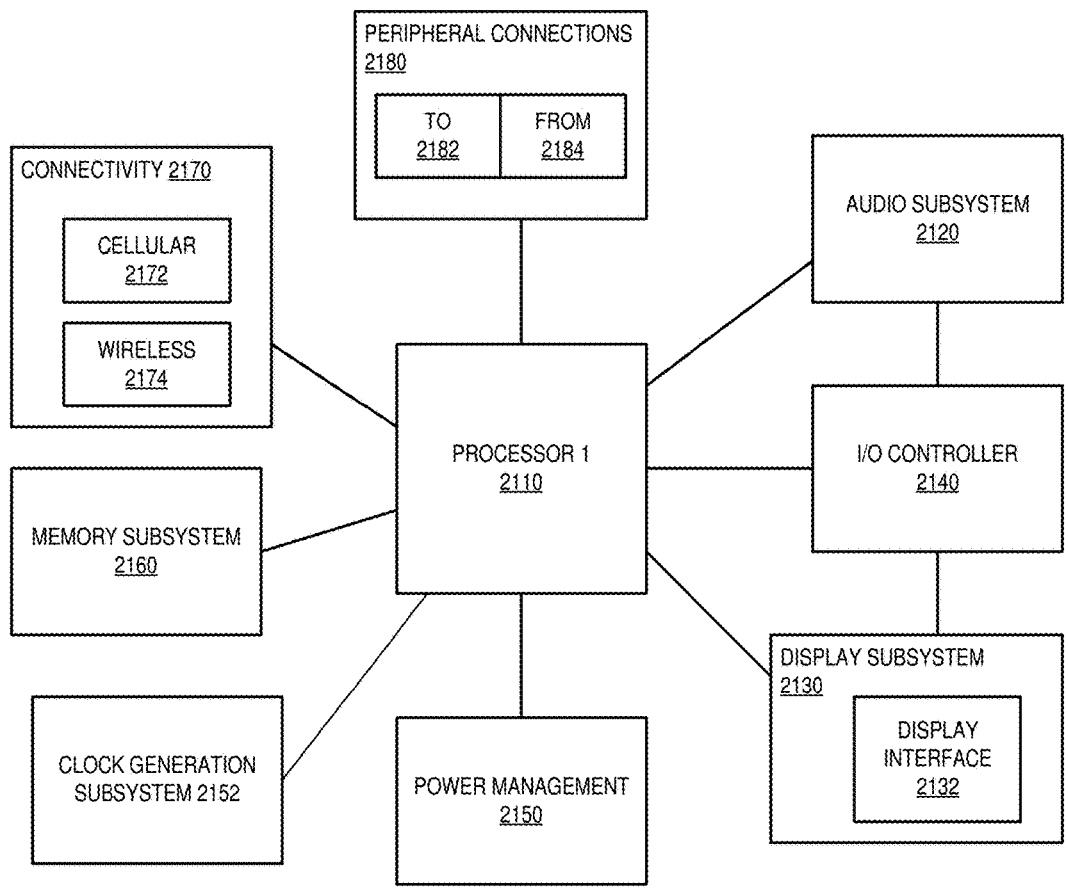
FIG. 6 illustrates a smart device or a computer system or a SoC (System-on-Chip) with a clock generation system that filters RF noise from a generated clock signal, in accordance with some embodiments.

FIG. 6 illustrates a smart device or a computer system or a SoC (System-on-Chip) 2100 with a clock generation system 2152 that filters RF noise from a generated clock signal, in accordance with some embodiments. It is pointed out that those elements of FIG. 6 having the same reference numbers (or names) as the elements of any other figure can operate or function in any manner similar to that described, but are not limited to such. In some embodiments, a clock generation system 2152 that filters RF noise from a generated clock signal can be placed in any of the blocks described with reference to system 2100.

FIG. 6 illustrates a block diagram of an embodiment of a mobile device in which flat surface interface connectors could be used. In some embodiments, computing device 2100 represents an appropriate computing device, such as a computing tablet, a mobile phone or smart-phone, a laptop, a desktop, an IOT device, a server, a set-top box, a wireless-enabled e-reader, or the like. It will be understood that certain components are shown generally, and not all components of such a device are shown in computing device 2100.

In some embodiments, computing device 2100 includes a first processor 2110. The various embodiments of the present disclosure may also comprise a network interface within 2170 such as a wireless interface so that a system embodiment may be incorporated into a wireless device, for example, cell phone or personal digital assistant.

In one embodiment, processor 2110 can include one or more physical devices, such as microprocessors, application processors, microcontrollers, programmable logic devices, or other processing means. The processing operations performed by processor 2110 include the execution of an operating platform or operating system on which applications and/or device functions are executed. The processing operations include operations related to I/O (input/output) with a human user or with other devices, operations related to power management, and/or operations related to connecting the computing device 2100 to another device. The processing operations may also include operations related to audio I/O and/or display I/O.

In one embodiment, computing device 2100 includes audio subsystem 2120, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 2100, or connected to the computing device 2100. In one embodiment, a user interacts with the computing device 2100 by providing audio commands that are received and processed by processor 2110.

Display subsystem 2130 represents hardware (e.g., display devices) and software (e.g., drivers) components that provide a visual and/or tactile display for a user to interact with the computing device 2100. Display subsystem 2130 includes display interface 2132, which includes the particular screen or hardware device used to provide a display to a user. In one embodiment, display interface 2132 includes logic separate from processor 2110 to perform at least some processing related to the display. In one embodiment, display subsystem 2130 includes a touch screen (or touch pad) device that provides both output and input to a user.

I/O controller 2140 represents hardware devices and software components related to interaction with a user. I/O controller 2140 is operable to manage hardware that is part of audio subsystem 2120 and/or display subsystem 2130. Additionally, I/O controller 2140 illustrates a connection point for additional devices that connect to computing device 2100 through which a user might interact with the system. For example, devices that can be attached to the computing device 2100 might include microphone devices, speaker or stereo systems, video systems or other display devices, keyboard or keypad devices, or other I/O devices for use with specific applications such as card readers or other devices.

As mentioned above, I/O controller 2140 can interact with audio subsystem 2120 and/or display subsystem 2130. For example, input through a microphone or other audio device can provide input or commands for one or more applications or functions of the computing device 2100. Additionally, audio output can be provided instead of, or in addition to display output. In another example, if display subsystem 2130 includes a touch screen, the display device also acts as an input device, which can be at least partially managed by I/O controller 2140. There can also be additional buttons or switches on the computing device 2100 to provide I/O functions managed by I/O controller 2140.

In one embodiment, I/O controller 2140 manages devices such as accelerometers, cameras, light sensors or other environmental sensors, or other hardware that can be included in the computing device 2100. The input can be part of direct user interaction, as well as providing environmental input to the system to influence its operations (such as filtering for noise, adjusting displays for brightness detection, applying a flash for a camera, or other features).

In one embodiment, computing device 2100 includes power management 2150 that manages battery power usage, charging of the battery, and features related to power saving operation. Memory subsystem 2160 includes memory devices for storing information in computing device 2100. Memory can include nonvolatile (state does not change if power to the memory device is interrupted) and/or volatile (state is indeterminate if power to the memory device is interrupted) memory devices. Memory subsystem 2160 can store application data, user data, music, photos, documents, or other data, as well as system data (whether long-term or temporary) related to the execution of the applications and functions of the computing device 2100.

In one embodiment, computing device 2100 includes a clock generation subsystem 2152. The clock generation subsystem 2152, for example, includes an oscillator circuit, e.g., one of the oscillator circuits 104, 300, or 300a as previously discussed herein. Various techniques to mitigate RF noise in a clock signal, as discussed herein with respect to FIGS. 1A, 1B, 3, and 4, can be employed in the clock generation subsystem 2152 to mitigate noise.

Referring back to FIG. 6, elements of embodiments are also provided as a machine-readable medium (e.g., memory 2160) for storing the computer-executable instructions (e.g., instructions to implement any other processes discussed herein). The machine-readable medium (e.g., memory 2160) may include, but is not limited to, flash memory, optical disks, CD-ROMs, DVD ROMs, RAMS, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 2170 includes hardware devices (e.g., wireless and/or wired connectors and communication hardware) and software components (e.g., drivers, protocol stacks) to enable the computing device 2100 to communicate with external devices. The computing device 2100 could be separate devices, such as other computing devices, wireless access points or base stations, as well as peripherals such as headsets, printers, or other devices.

Connectivity 2170 can include multiple different types of connectivity. To generalize, the computing device 2100 is illustrated with cellular connectivity 2172 and wireless connectivity 2174. Cellular connectivity 2172 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 2174 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 2180 include hardware interfaces and connectors, as well as software components (e.g., drivers, protocol stacks) to make peripheral connections. It will be understood that the computing device 2100 could both be a peripheral device ("to" 2182) to other computing devices, as well as have peripheral devices ("from" 2184) connected to it. The computing device 2100 commonly has a "docking" connector to connect to other computing devices for purposes such as managing (e.g., downloading and/or uploading, changing, synchronizing) content on computing device 2100. Additionally, a docking connector can allow computing device 2100 to connect to certain peripherals that allow the computing device 2100 to control content output, for example, to audiovisual or other systems.

In addition to a proprietary docking connector or other proprietary connection hardware, the computing device 2100 can make peripheral connections 2180 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following example clauses pertain to further embodiments. Specifics in the example clauses may be used anywhere in one or more embodiments. All optional features of the apparatus described herein may also be implemented with respect to a method or process.

Clause 1. An apparatus comprising: an oscillator circuit to generate a clock signal and to transmit the clock signal over a signal line; a ground reference plane associated with the signal line; and one or more patterns formed in the ground reference plane, wherein the one or more patterns in the ground reference plane is to filter out noise from the clock signal transmitted over the signal line.

Clause 2. The apparatus of clause 1, wherein the one or more patterns in the ground reference plane is formed by selectively etching the ground reference plane.

Clause 3. The apparatus of one of clauses 1 or 2, wherein the one or more patterns in the ground reference plane comprises: a first pattern that is formed on a first side of the signal line; a second pattern that is formed on a second side of the signal line; and a third pattern interconnecting the first pattern and the second pattern, wherein at least a section of the third pattern is formed underneath the signal line.

Clause 4. The apparatus of clause 3, wherein the first pattern comprises a meandering line.

Clause 5. The apparatus of clause 3, wherein the first pattern and the second pattern are symmetric.

Clause 6. The apparatus of any of clauses 1-5, wherein: the clock signal has a first frequency; and the one or more patterns in the ground reference plane is to filter out the noise that has a second frequency, the second frequency being substantially higher than the first frequency.

Clause 7. The apparatus of any of clauses 1-6, wherein: the one or more patterns in the ground reference plane is configured as a radio frequency filter; and the radio frequency filter is tuned by configuring one or more of a shape, a size, or a position of the one or more patterns.

Clause 8. The apparatus of any of clauses 1-7, wherein: at least a part of the ground reference plane is formed on a first layer of a substrate; and at least a part of the signal line is formed over a second layer of the substrate such that the ground reference plane is at a different plane than the signal line.

Clause 9. The apparatus of clause 8, wherein the oscillator circuit is formed on the substrate.

Clause 10. A semiconductor package comprising: a semiconductor die; and the apparatus of any of clauses 1-9.

Clause 11. An oscillator circuit comprising: a crystal coupled to a first node and a second node; a biasing resistor coupled to the first node and the second node; and one or more branches coupled between the second node and a ground, wherein the one or more branches includes a first branch comprising a first biasing capacitor and a first inductor coupled in series.

Clause 12. The oscillator circuit of clause 11, wherein a clock signal is generated on the first node.

Clause 13. The oscillator circuit of any of clauses 11-12, wherein the one or more branches includes a second branch comprising a second biasing capacitor and a second inductor coupled in series, the first branch being parallel to the second branch.

Clause 14. The oscillator circuit of clause 13, further comprising: a third biasing capacitor coupled between the first node and the ground, wherein a sum of a first capacitance of the first biasing capacitor and a second capacitance of the second biasing capacitor is substantially equal to a third capacitance of the third biasing capacitor.

Clause 15. The oscillator circuit of clause 13, wherein: the first branch comprising the first biasing capacitor and the first inductor is tuned to a first frequency; the second branch comprising the second biasing capacitor and the second inductor is tuned to a second frequency; the first branch is to filter out noise signal of the first frequency from a clock signal generated by the oscillator circuit; and the second branch is to filter out noise signal of the second frequency from the clock signal generated by the oscillator circuit.

Clause 16. A system comprising: a memory; a processor coupled to the memory and to receive a clock signal from an oscillator circuit over a signal line; the oscillator circuit formed on a substrate, the oscillator circuit to generate the clock signal and transmit the clock signal over the signal line to the processor; a ground reference plane formed on the substrate, the ground reference plane forming a return path of current from the processor to the oscillator circuit, wherein the ground reference plane is patterned to form one or more patterns in the ground reference plane, and wherein the one or more patterns in the ground reference plane is to filter out noise from the clock signal transmitted over the signal line; and a wireless interface for allowing the processor to communicate with another device.

Clause 17. The system of clause 16, wherein the one or more patterns in the ground reference plane is formed by selectively etching the ground reference plane.

Clause 18. The system of any of clauses 16-17, wherein the one or more patterns in the ground reference plane comprises: a first pattern that is formed on a first side of the signal line; a second pattern that is formed on a second side of the signal line; and a third pattern interconnecting the first pattern and the second pattern, wherein at least a section of the third pattern is formed underneath the signal line.

Clause 19. The system of clause 18, wherein the first pattern and the second pattern are symmetric.

Clause 20. The system of any of clauses 16-19, wherein: the clock signal has a first frequency; and the one or more patterns in the ground reference plane is to filter out the noise that has a second frequency, the second frequency being substantially higher than the first frequency.

Clause 21. The system of any of clauses 16-20, wherein: the one or more patterns in the ground reference plane is configured as a radio frequency filter; and the radio frequency filter is tuned by configuring one or more of a shape, a size, or a position of the one or more patterns.

Clause 22. A method comprising: generating, by an oscillator circuit, a clock signal; transmitting the clock signal over a signal line, wherein a ground reference plane is associated with the signal line, and wherein one or more patterns are formed in the ground reference plane; and filtering out, by the one or more patterns in the ground reference plane, noise from the clock signal transmitted over the signal line.

Clause 23. The method of clause 22, further comprising: forming the one or more patterns in the ground reference plane by selectively etching the ground reference plane.

Clause 24. The method of clause 23, wherein forming the one or more patterns in the ground reference plane comprises: forming a first pattern on a first side of the signal line; forming a second pattern on a second side of the signal line; and forming a third pattern that interconnects the first pattern and the second pattern, wherein at least a section of the third pattern is formed underneath the signal line.

Clause 25. The method of clause 24, wherein: the first pattern comprises a meandering line; and the first pattern and the second pattern are symmetric.

Clause 26. The method of any of clauses 22-25, wherein the clock signal has a first frequency, and wherein filtering out the noise comprises: filtering out the noise that has a second frequency, the second frequency being substantially higher than the first frequency.

Clause 27. An apparatus comprising: means for generating a clock signal; means for transmitting the clock signal over a signal line, wherein a ground reference plane is associated with the signal line, and wherein one or more patterns are formed in the ground reference plane; and means for filtering out, using the one or more patterns in the ground reference plane, noise from the clock signal transmitted over the signal line.

Clause 28. The apparatus of clause 27, further comprising: means for forming the one or more patterns in the ground reference plane by selectively etching the ground reference plane.

Clause 29. The apparatus of clause 28, wherein the means for forming the one or more patterns in the ground reference plane comprises: means for forming a first pattern on a first side of the signal line; means for forming a second pattern on a second side of the signal line; and means for forming a third pattern that interconnects the first pattern and the second pattern, wherein at least a section of the third pattern is formed underneath the signal line.

Clause 30. The method of clause 29, wherein: the first pattern comprises a meandering line; and the first pattern and the second pattern are symmetric.

Clause 31. The apparatus of any of clauses 27-30, wherein the clock signal has a first frequency, and wherein the means for filtering out the noise comprises: means for filtering out the noise that has a second frequency, the second frequency being substantially higher than the first frequency.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
   an oscillator circuit to generate a clock signal and to transmit the clock signal over a signal line;
   a ground reference plane associated with the signal line; and
   one or more patterns in the ground reference plane,
   wherein the one or more patterns in the ground reference plane is to filter noise from the clock signal transmitted over the signal line; and
   wherein the one or more patterns in the ground reference plane comprises:
      a first pattern on a first side of the signal line;
      a second pattern on a second side of the signal line; and
      a third pattern to interconnect the first pattern and the second pattern, wherein at least a section of the third pattern is underneath the signal line.

2. The apparatus of claim 1, wherein the one or more patterns in the ground reference plane is selectively etched in the ground reference plane.

3. The apparatus of claim 1, wherein the first pattern comprises a meandering line.

4. The apparatus of claim 1, wherein the first pattern and the second pattern are symmetric.

5. The apparatus of claim 1, wherein:
the clock signal has a first frequency; and
the one or more patterns in the ground reference plane is to filter the noise that has a second frequency, the second frequency being substantially higher than the first frequency.

6. The apparatus of claim 1, wherein:
the one or more patterns in the ground reference plane comprises a radio frequency filter; and
the radio frequency filter is tuned with one or more of a shape, a size, or a position of the one or more patterns.

7. The apparatus of claim 1, wherein:
at least a part of the ground reference plane is on a first layer of a substrate; and
at least a part of the signal line is over a second layer of the substrate such that the ground reference plane is at a different plane than the signal line.

8. The apparatus of claim 7, wherein the oscillator circuit is on the substrate.

9. An oscillator circuit comprising:
a crystal coupled to a first node and a second node;
a resistor coupled to the first node and the second node; and
one or more branches coupled between the second node and a ground, wherein the one or more branches includes a first branch comprising a first capacitor and a first inductor coupled in series, and wherein the one or more branches includes a second branch comprising a second capacitor and a second inductor coupled in series, the first branch being parallel to the second branch;
a third capacitor coupled between the first node and the ground; and
wherein a sum of a first capacitance of the first capacitor and a second capacitance of the second capacitor is substantially equal to a third capacitance of the third capacitor.

10. The oscillator circuit of claim 9, wherein a clock signal is generated on the first node.

11. The oscillator circuit of claim 10, wherein:
the first branch is tuned to a first frequency;
the second branch is tuned to a second frequency;
the first branch is to filter noise signal of the first frequency from a clock signal generated by the oscillator circuit; and
the second branch is to filter noise signal of the second frequency from the clock signal generated by the oscillator circuit.

12. A system comprising:
a memory;
a processor coupled to the memory and to receive a clock signal from an oscillator circuit over a signal line;
the oscillator circuit on a substrate, the oscillator circuit to generate the clock signal and transmit the clock signal over the signal line to the processor; and
a ground reference plane on the substrate, the ground reference plane is to provide a return path of current from the processor to the oscillator circuit,
wherein:
the ground reference plane is patterned with one or more patterns in the ground reference plane,
the one or more patterns in the ground reference plane is to filter noise from the clock signal transmitted over the signal line;
the clock signal has a first frequency;
the one or more patterns in the ground reference plane is to filter the noise that has a second frequency; and
the second frequency is substantially higher than the first frequency; and
a wireless interface to allow the processor to communicate with another device.

13. The system of claim 12, wherein the one or more patterns in the ground reference plane is selectively etched in the ground reference plane.

14. The system of claim 12, wherein the one or more patterns in the ground reference plane comprises:
a first pattern on a first side of the signal line;
a second pattern on a second side of the signal line; and
a third pattern to interconnect the first pattern and the second pattern, wherein at least a section of the third pattern is underneath the signal line.

15. The system of claim 14, wherein the first pattern and the second pattern are symmetric.

16. The system of claim 12, wherein:
the one or more patterns in the ground reference plane comprises a radio frequency filter; and
the radio frequency filter is tuned with one or more of a shape, a size, or a position of the one or more patterns.

* * * * *